United States Patent
Suzuki

(10) Patent No.: US 6,507,052 B1
(45) Date of Patent: Jan. 14, 2003

(54) SEMICONDUCTOR MEMORY DEVICE WITH IMPROVED REFERENCE SECTION

(75) Inventor: Kazuteru Suzuki, Kanagawa (JP)

(73) Assignee: NEC Corporation, Tokyo (JP)

( * ) Notice: Subject to any disclaimer, the term of this patent is extended or adjusted under 35 U.S.C. 154(b) by 150 days.

(21) Appl. No.: 09/643,161

(22) Filed: Aug. 21, 2000

(30) Foreign Application Priority Data

Aug. 23, 1999 (JP) .......................................... 11-235401

(51) Int. Cl.[7] .............................................. H01L 27/10
(52) U.S. Cl. ....................... 257/207; 257/208; 257/211; 438/129
(58) Field of Search .................................. 257/203, 207, 257/208, 211, 390; 438/129, 130; 365/104, 102; 716/8, 10, 17

(56) References Cited

U.S. PATENT DOCUMENTS

| | | | | |
|---|---|---|---|---|
| 4,586,238 A | * | 5/1986 | Yatsuda et al. | 148/DIG. 117 |
| 4,709,351 A | * | 11/1987 | Kajigaya | 257/390 |
| 5,392,233 A | * | 2/1995 | Iwase | 365/104 |
| 5,416,347 A | * | 5/1995 | Katto et al. | 257/296 |
| 5,534,724 A | * | 7/1996 | Nagamine | 257/202 |
| 5,812,461 A | * | 9/1998 | Komarek et al. | 326/58 |
| 5,929,494 A | * | 7/1999 | Li | 257/390 |

FOREIGN PATENT DOCUMENTS

JP  3-63-25881  * 2/1988 .......... G11C/11/34

* cited by examiner

Primary Examiner—Eddie Lee
Assistant Examiner—George C. Eckert, II
(74) Attorney, Agent, or Firm—Hayes Soloway PC

(57) ABSTRACT

A semiconductor memory device has a reference section which includes a first reference cell block and second reference cell blocks. The first reference cell block includes a second contact diffusion region which is arranged under a virtual ground line and is connected to this virtual ground line via a contact hole. The second reference cell blocks include first and third contact diffusion regions which are arranged under a bit line and can be connected to the bit line via contact holes as needed. Thereby, the number of reference cell blocks to be connected in series can be selected freely, allowing finer settings of a reference current value.

9 Claims, 10 Drawing Sheets

☒ CHANNEL STOPPER

SEMICONDUCTOR MEMORY DEVICE WITH IMPROVED REFERENCE SECTION

BACKGROUND OF THE INVENTION

1. Field of the Invention

The invention relates to a semiconductor memory device, and more particularly to the improvement of a reference section which generates a reference current for use in identification of data in a memory cell selected.

2. Description of the Related Art

In some methods for reading data from a semiconductor memory device, an electric current ISA flowing through a memory cell and a reference current IRA are compared with each other to make 0/1 identification of data. These methods are widely used, for example, in read only memories and the like having flat type memory cells.

For easy understanding of the subsequent description, an explanation will here be made on the general configuration of a typical read only semiconductor memory chip using flat type memory cells to which the present invention is applicable.

FIG. 1 is a plan view showing the general configuration of a semiconductor memory chip using flat type memory cells. FIGS. 2A and 2B are plan views showing the general configuration of a unit memory cell block constituting a memory cell array section in the semiconductor memory device and an example of the arrangement thereof, respectively. FIG. 3 is a plan view schematically showing the positional relation between a metal wiring, serving as a bit line or a virtual ground line, and diffusion regions for contact in a memory cell array section.

Moreover, FIG. 4 is a schematic plan view showing the arrangement of the contact diffusion regions in each reference cell block constituting a conventional reference section of the semiconductor memory device, in a simplified form for the sake of clarity. FIG. 5 is a schematic plan view showing an example of the general configuration of this reference section, along with a part of a memory cell array section.

First, referring to FIGS. 1–3, a memory chip 1 of the semiconductor memory device using flat type memory cells comprises memory cell array sections 2, reference sections 3, decoder sections 4, peripheral circuit sections 5, and the like.

To improve the degree of integration, the memory cell array sections 2 are usually composed of memory cell blocks 10 arranged as shown in FIG. 2B. In the vertical direction, the memory cell blocks 10 are arranged to be symmetric to one another about the border lines thereof, and more specifically, so that they make vertical turns at the respective centers of first contact diffusion regions 13 and second contact diffusion regions 14 in FIG. 2A. In the horizontal direction, the memory cell blocks 10 are arranged parallel to one another.

Each of the memory cell blocks 10 includes a memory cell part 11, block selector parts 12 and 19, and the first and second contact diffusion regions 13 and 14 for establishing connection with a bit line 17 and a virtual ground line 18. Besides, the memory cell part 11 and the block selector parts 12, 19 include a plurality of diffusion layers 20, word lines 21a, and block selecting signal lines 22a. The diffusion layers 20 are arranged parallel to one another. The word lines 21a and the block selecting signal lines 22a are orthogonal to the diffusion layers 20.

As mentioned above, the memory cell array sections 2 comprise the memory cell blocks 10 which are arranged to make turns at the respective centers of the first contact diffusion regions 13 (13a–13d, in FIG. 3) and the second contact diffusion regions 14 (14a–14d, in FIG. 3). With respect to each bit line 17, 17a and each virtual ground line 18, 18a, the first contact diffusion regions 13, 13a–13d and the second contact diffusion regions 14, 14a–14d, along with the contact holes 15, 15a–15d and the contact holes 16, 16a–16d, are arranged in the proportions of ones to two memory cell blocks 10, thereby establishing connection with the bit line 17, 17a and the virtual ground line 18, 18a, respectively.

Now, referring to FIGS. 4 and 5, a conventional reference section 30 in this semiconductor memory device comprises reference cell blocks 31 having the same configuration as that of the memory cell blocks 10. The reference cell blocks 31 are also arranged to make vertical turns at the respective centers of first contact diffusion regions 32a–32d and second contact diffusion regions 33a–33d. The contact diffusion regions at required positions, e.g. the first contact diffusion region 32b and the second contact diffusion region 33d in FIG. 4, are provided with contact holes 34 and 35 to establish connection with a bit line 27 and a virtual ground line 28, respectively.

FIG. 6 is a schematic circuit diagram for explaining the methods of selecting and reading a memory cell in the reference cell when reading data from a memory cell in the semiconductor memory device described above.

Referring to FIG. 6, upon data read from a flat type memory cell 611a, the value of a current ISA and the value of a current IRA are compared with each other so that their magnitudes are judged by a sense amplifier 600 to make 0/1 identification of the data stored in the memory cell 611a. Here, ISA is a current that flows through a first contact diffusion region 613a, the memory cell 611a, and a second contact diffusion region 614a to a virtual ground line when a bit line drive circuit 601 gives a potential to the bit line to select the memory cell 611a. IRA is a current that flows through a first contact diffusion region 632a, a memory cell transistor 671a, a second contact diffusion region 633a, a memory cell transistor 617b, a first contact diffusion region 632b, a memory cell transistor 617c, and a second contact diffusion region 633b to a virtual ground line when a bit line drive circuit 602 gives a potential to the bit line in the reference section.

The memory cell transistors, however, vary in ON current value ISO because of fluctuations in manufacture conditions and the like. Accordingly, IRA is usually set to 1/k of ISO (where k is an integer not smaller than "2") for surer data identification.

In this example, the three reference cell blocks 631a–631c are connected in series to set the reference current value IRA to ⅓ the ON current value ISO of the memory cell transistors.

In recent years, finer processes have increased variations in device characteristics (a drop in ON current, a rise in OFF current (leak current), and the like) even within an identical chip. Accordingly, there has been an increasing need for the finer settings of the reference current value IRA so as to improve the accuracy of the data identification in memory cells.

Nevertheless, the conventional reference section 30 is constituted so that the reference cell blocks 31 having the same configuration as that of the memory cell blocks 10 make turns at the centers of the respective contact diffusion regions as in the memory cell array sections 2. Therefore, the bit line 27 or the virtual ground line 28, consisting of metal wiring, and the first and second contact diffusion regions 32a–32d, 33a–33d come into such physical relation as shown in FIG. 4.

In general, connecting a plurality of reference cell blocks 31 in series requires that a current path also run from a first contact diffusion region 32a–32d through the reference cell blocks 31 and reach a virtual ground line 28 via a second contact diffusion region 33a–33d. Thus, the positions to connect the bit line 27 and the virtual ground line 28 with the first contact diffusion region 32a–32d and the second contact diffusion region 33a–33d, respectively, determine the number of blocks in the serial connection.

Since the first contact diffusion regions and the second contact diffusion regions are arranged alternately in the proportions of ones to two reference cell blocks 31 as shown in FIG. 4, the reference cell blocks 31 connected in series cannot usually realize a serial connection of even number.

This has brought about the problem that the reference current value IRA can only be set to $1/(2m-1)$ of ISO (where m is an integer not less than "1"), hampering finer settings of the reference current value IRA.

SUMMARY OF THE INVENTION

An object of the present invention is to provide a semiconductor memory device whose reference sections are devised in pattern configuration so that the number of reference cell blocks to be connected in series is not limited to odd numbers and can be set freely, thereby allowing finer settings of the reference current value.

A semiconductor memory device according to the present invention comprises a memory cell array section having a plurality of memory cell blocks arranged in a matrix, the memory cell blocks each including a plurality of memory cells; and a reference section for generating a reference current for use in identification of data stored in the memory cells. The reference section includes: a plurality of diffusion layers arranged parallel to each other; a plurality of word lines arranged parallel to each other along a direction orthogonal to the diffusion layers; a plurality of MOS transistors having sources and drains made of the intersections of the diffusion layers and the word lines, and channels made of the portions sandwiched between the sources and drains; and first contact diffusion regions and second contact diffusion regions for connecting the diffusion layers with a bit line and a virtual ground line. All the second contact diffusion regions are provided with a contact to the virtual ground line.

The reference section may include a plurality of unit reference cell blocks each having the same size in a bit-line direction as that of the memory cell blocks. Here, the array pitch and the number of the reference cell blocks in the reference section are the same as the array pitch and the number in the bit-line direction of the memory cell blocks in the memory cell array section. Each of the reference cell blocks includes: a plurality of diffusion layers arranged parallel to each other; a plurality of word lines arranged parallel to each other along a direction orthogonal to the diffusion layers; a plurality of MOS transistors having sources and drains made of the intersections of the diffusion layers and the word lines, and channels made of the portions sandwiched between the sources and drains; a first contact diffusion region and a second contact diffusion region for connecting the diffusion layers with a bit line and a virtual ground line, respectively; a plurality of block selecting signal lines arranged between the word lines and at least either one of the first contact diffusion region and the second contact diffusion region so as to be parallel to the word lines; and block selecting transistors having sources and drains made of the intersections of the plurality of diffusion layers and the block selecting signal lines. All the second contact diffusion regions formed under the virtual ground line are provided with a contact to the virtual ground line.

Each of the memory cell blocks may also include: a plurality of diffusion layers arranged parallel to each other; a first contact diffusion region and a second contact diffusion region for connecting the diffusion layers with a bit line and a virtual ground line, respectively; a plurality of word lines arranged between the first contact diffusion region and the second contact diffusion region so as to be parallel to each other along a direction orthogonal to the diffusion layers; a plurality of memory cells having sources and drains made of the intersections of the diffusion layers and the word lines, and channels made of the portions sandwiched between the sources and drains; a plurality of block selecting signal lines arranged between the word lines and the first contact diffusion region as well as the second contact diffusion regions, so as to be parallel to the word lines; and block selecting transistors having sources and drains made of the intersections of the plurality of diffusion layers and the block selecting signal lines.

Here, the word lines, the diffusion layers, and the block selecting signal lines in the reference cell blocks and the memory cell blocks are preferably identical to each other in array pitch and in width.

Moreover, any of the reference cell blocks, when generating the reference current, activates no more than one MOS transistor among the plurality of MOS transistors made of the word lines and the diffusion layers in the reference cell block.

Furthermore, another semiconductor memory device according to the present invention comprises memory cell blocks and reference cell blocks. Each of the blocks includes: a plurality of diffusion layers arranged parallel to each other; a first contact diffusion region and a second contact diffusion region formed under a bit line and a virtual ground line, for connecting the diffusion layers with the bit line and the virtual ground line, respectively; a plurality of word lines arranged between the first contact diffusion region and the second contact diffusion region, so as to be parallel to each other along a direction orthogonal to the diffusion layers; a plurality of memory cells having sources and drains made of the intersections of the diffusion layers and the word lines, and channels made of the portions sandwiched between the sources and drains; a plurality of block selecting signal lines arranged between the word lines and the first contact diffusion region as well as the second contact diffusion region so as to be parallel to the word lines; and block selecting transistors having sources and drains made of the intersections of the plurality of diffusion layers and the block selecting signal lines. All those second contact diffusion regions of the reference cell blocks, not connected to the virtual ground line are shifted in parallel with the word lines to under the bit line to form third contact diffusion regions.

The nature, principle, and utility of the invention will become more apparent from the following detailed description when read in conjunction with the accompanying drawings in which like parts are designated by like reference numerals.

DETAILED DESCRIPTION OF THE PREFERRED EMBODIMENTS

Now, the present invention will be described with reference to the accompanying drawings.

Initially, description will be given of a first embodiment of the present invention.

In the present embodiment, the configuration of the semiconductor memory chip and the components thereof other than the reference sections are identical to the configuration and components of the conventional semiconductor memory chip shown in FIGS. 1, 2A, 2B, and 3. Thus, the following description will be made mainly on the reference sections.

Figure 7:
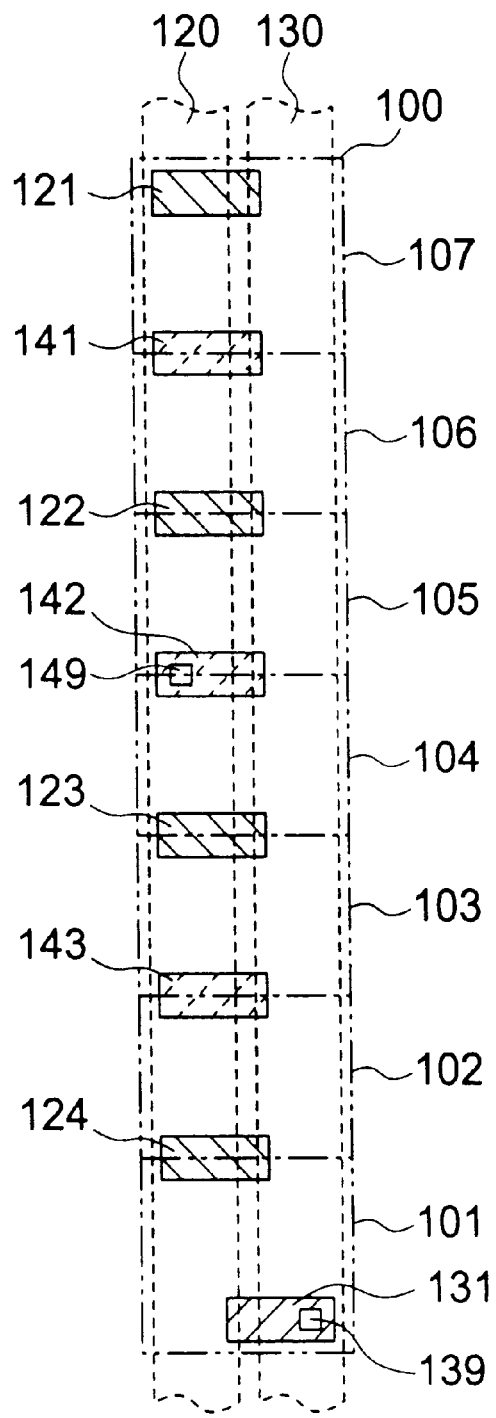
FIG. 7 is a schematic plan view showing, in simplified form, the arrangement of the contact diffusion regions in each reference cell block constituting a reference section in the semiconductor memory chip according to a first embodiment of the present invention.
Figure 8:
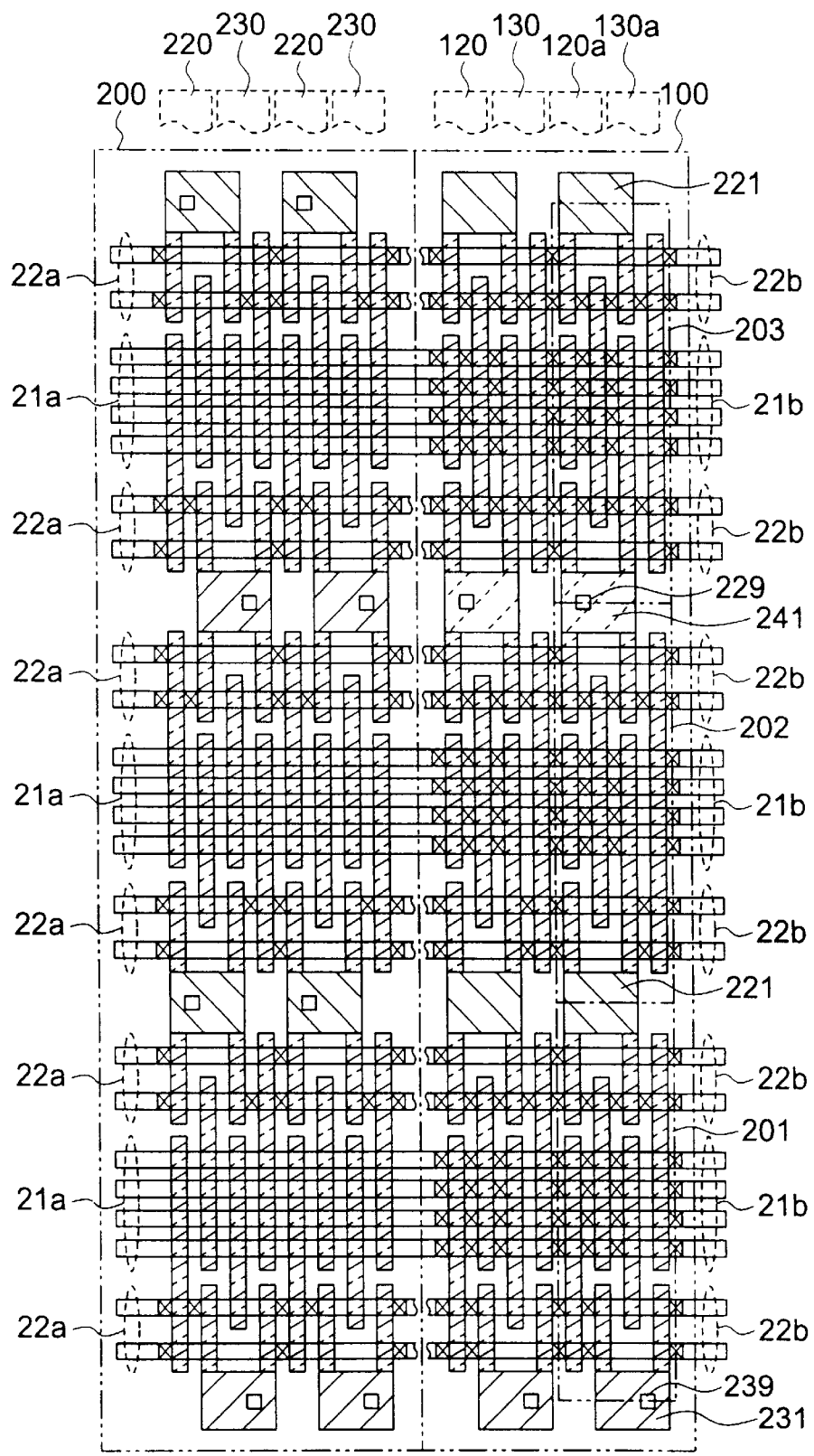
FIG. 8 is a schematic plan view showing the general configuration of a reference section in the semiconductor memory device according to the first embodiment of the present invention, along with a part of a memory cell array section.
Figure 9:
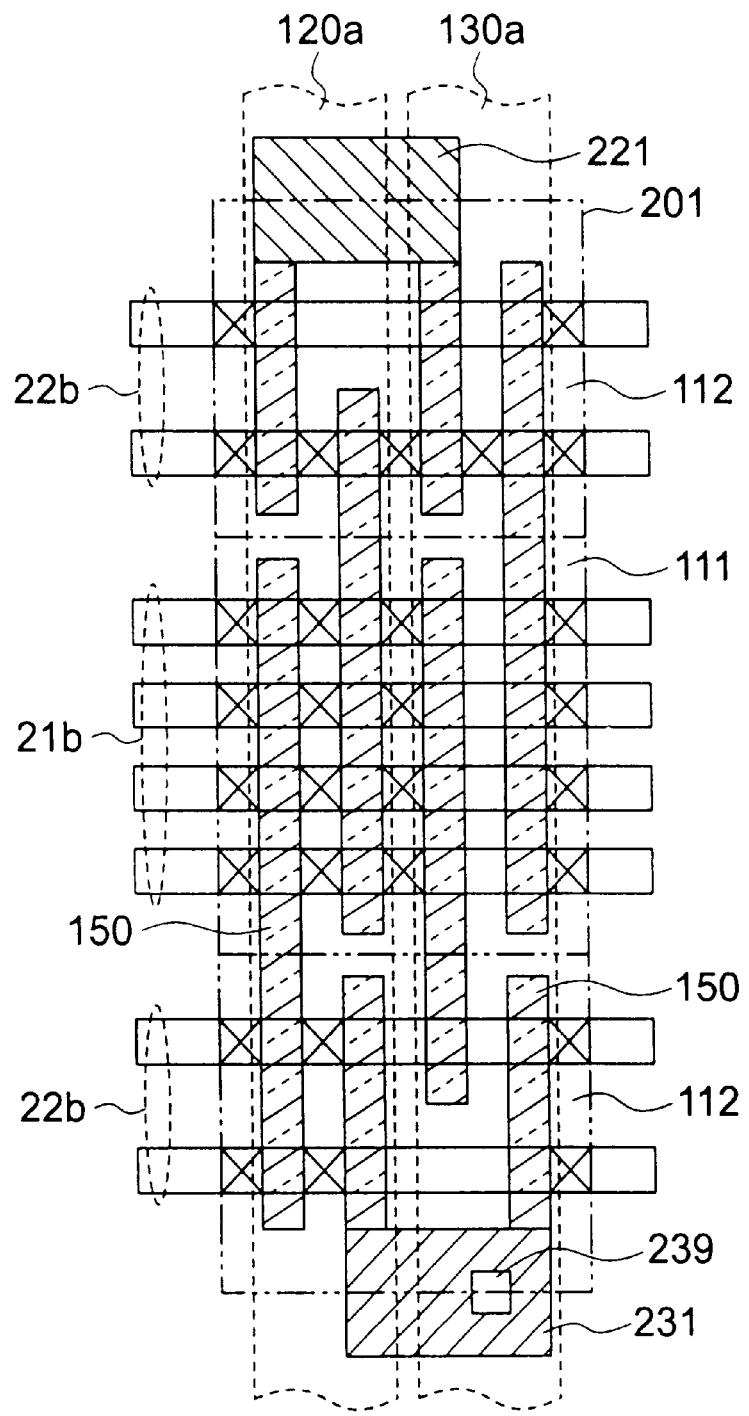
FIG. 9 is an enlarged plan view of the reference cell block 201 in FIG. 8.
Figure 10:
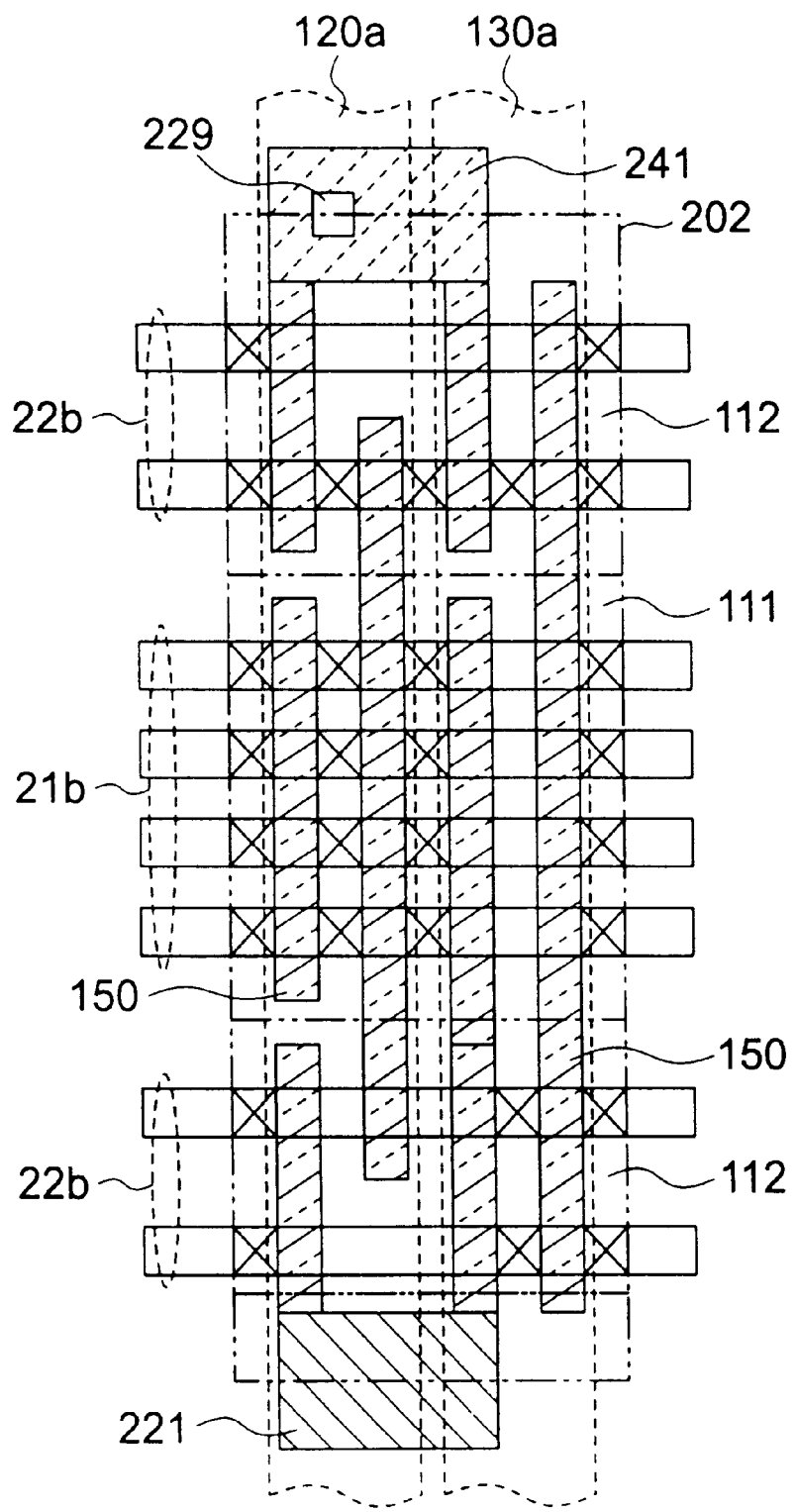
FIG. 10 is an enlarged plan view of the reference cell block 202 in FIG. 8.

FIG. 7 is a schematic diagram showing the arrangement of the contact diffusion regions in each reference cell block constituting a reference section in the chip of the semiconductor memory device of the first embodiment, in a simplified form for the sake of clarity. FIG. 8 is a schematic plan view showing the general configuration of the reference section, along with a part of a memory cell array section. Besides, FIGS. 9 and 10 are enlarged plan views showing the reference cell blocks 201 and 202 in FIG. 8, respectively.

Referring to FIG. 7, a reference section 100 in the semiconductor memory device of the present invention comprises a first reference cell block 101 and second reference cell blocks 102–107. The first reference cell block 101 includes a second contact diffusion region 131 which is placed under a virtual ground line 130 and connected to this virtual ground line 130 via a contact hole 139. The second reference cell blocks 102–107 include first and third contact diffusion regions 121–124 and 141–143, which are placed under a bit line 120 and can be connected to this bit line 120 via a contact hole as needed. In this example, the third contact diffusion region 142 is connected to the bit line 120 via a contact hole 149. That is, all the contact diffusion regions in the reference section of the semiconductor memory device of the present invention except the second contact diffusion region which is connected to a virtual ground line via a contact hole are arranged under a bit line.

Here, the second contact diffusion regions and the third contact diffusion regions will be described with a comparison of FIG. 7 (present embodiment) and FIG. 4 (prior art).

Figure 1:
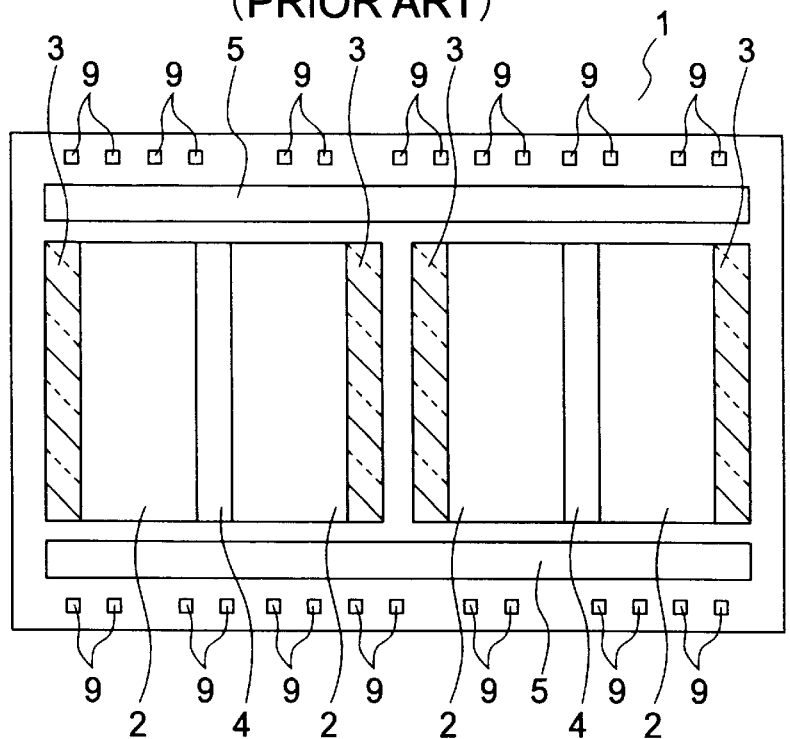
FIG. 1 is a plan view showing the general configuration of a semiconductor memory chip using flat type memory cells.
Figure 2A:
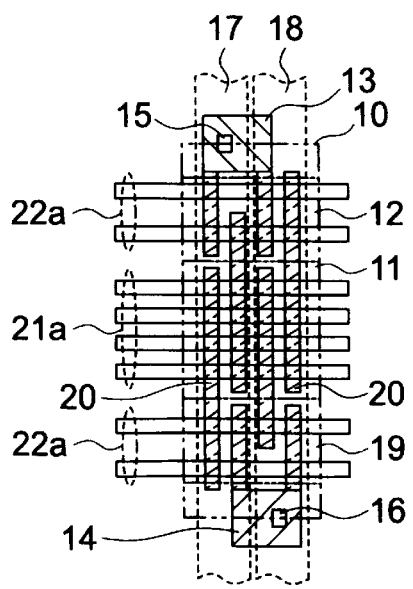
FIGS. 2A and 2B are plan views showing the general configuration of a unit memory cell block constituting a memory cell array section in the semiconductor memory device using flat type memory cells and an arrangement example thereof, respectively.
Figure 2B:
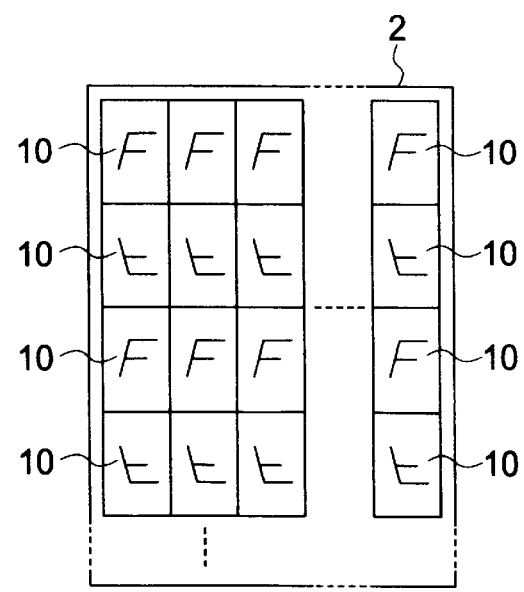
Figure 3:
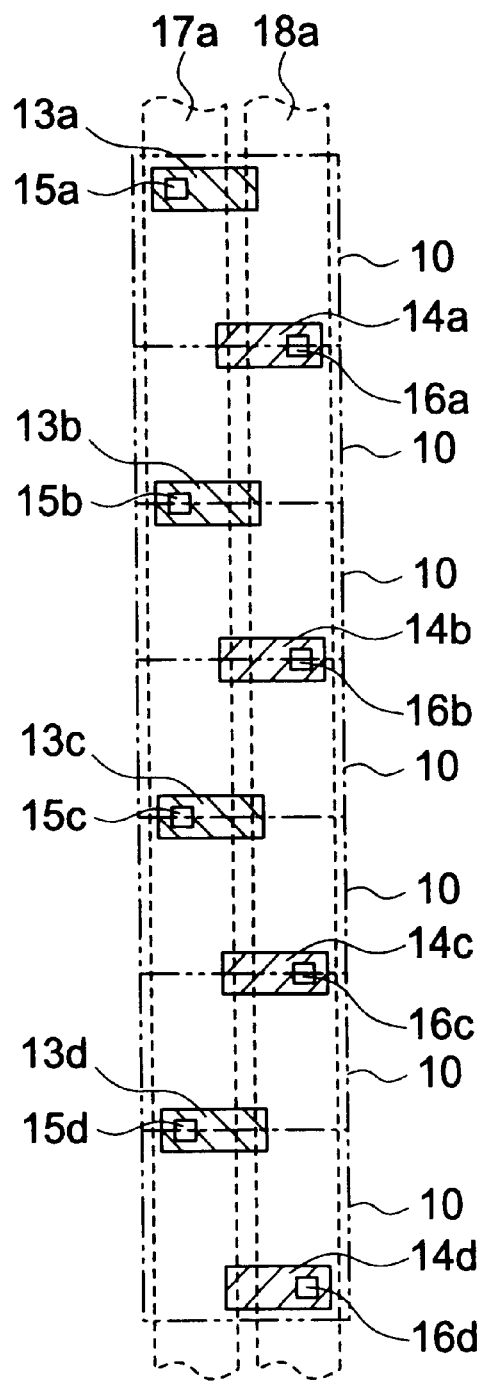
FIG. 3 is a plan view schematically showing the physical relation between a bit line or a virtual ground line and contact diffusion regions in a memory cell array section of the semiconductor memory device using flat type memory cells.
Figure 4:
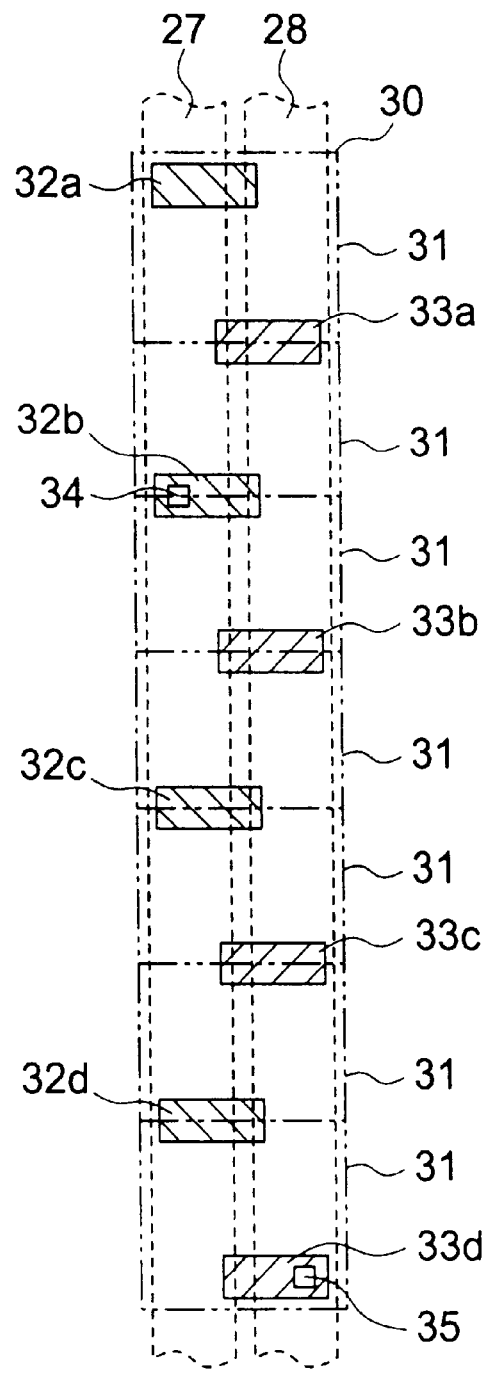
FIG. 4 is a schematic plan view showing, in simplified form, the arrangement of the contact diffusion regions in each reference cell block constituting a reference section in a conventional semiconductor memory device.
Figure 5:
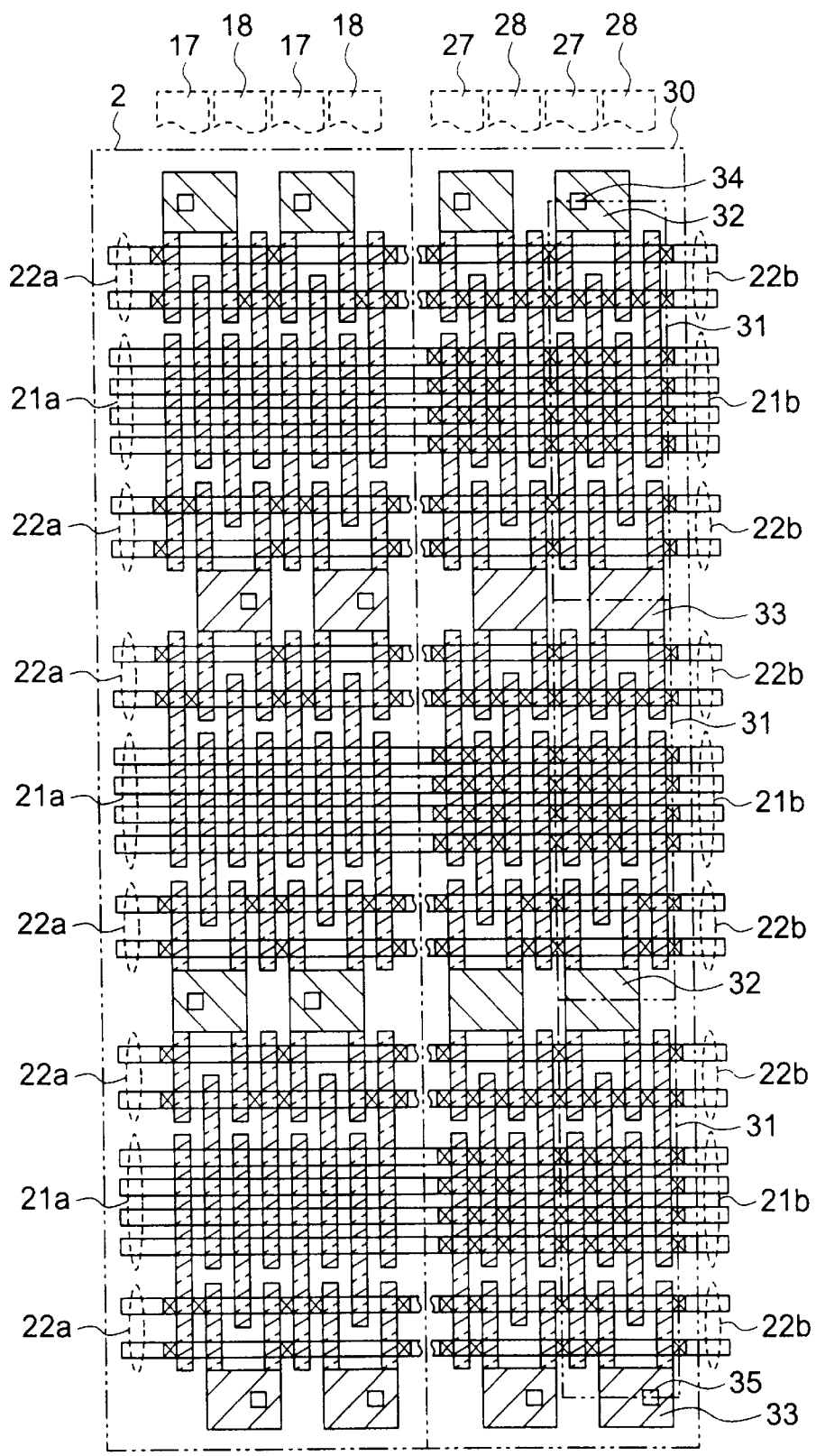
FIG. 5 is a schematic plan view showing an example of the general configuration of the reference section in a conventional semiconductor memory device, along with a part of a memory cell array section.
Figure 6:
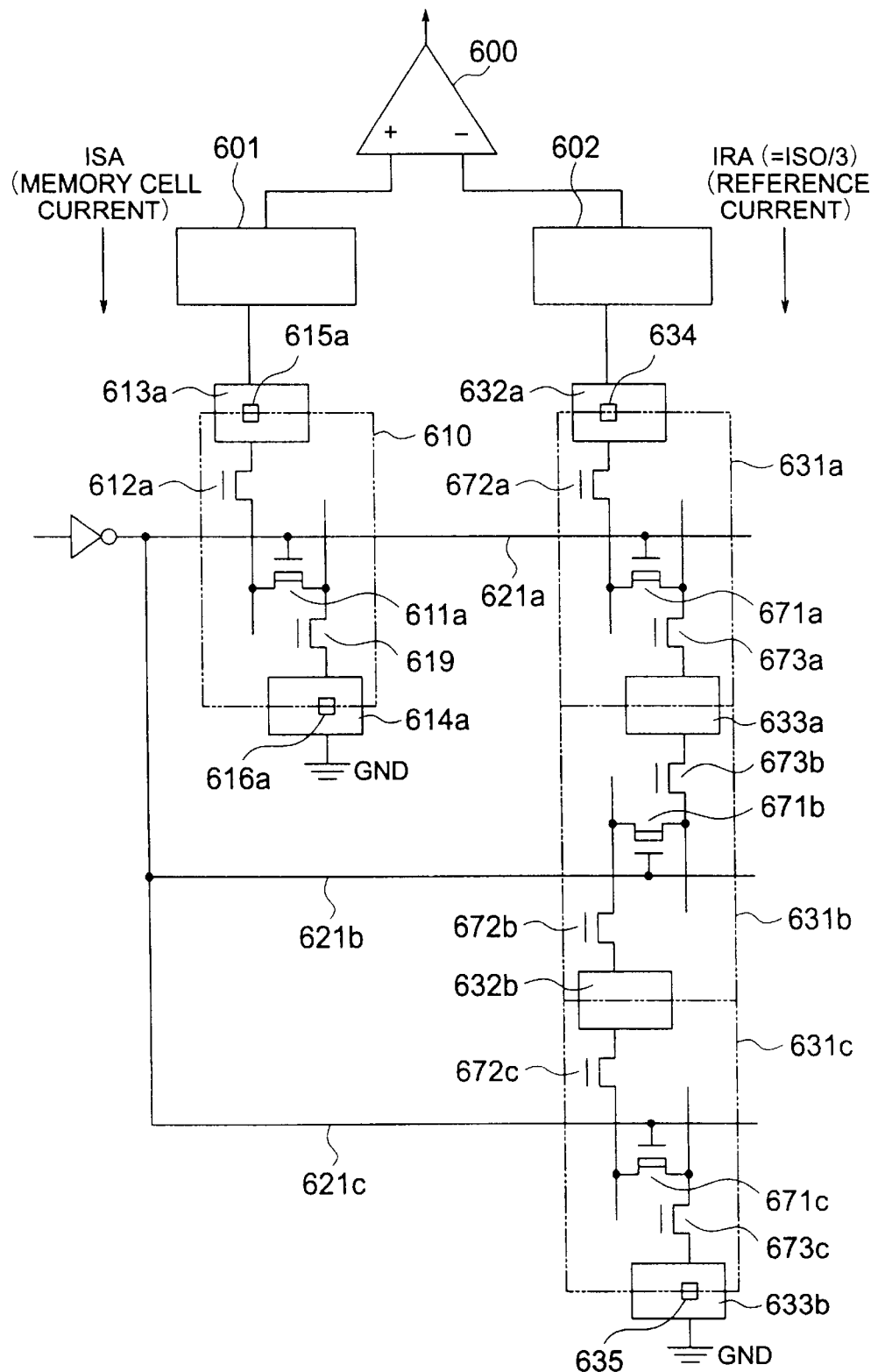
FIG. 6 is a schematic circuit diagram of a semiconductor memory device using flat type memory cells, the diagram explaining the method of selecting and reading a memory cell and a reference cell upon a data read from the memory cell.

The third contact diffusion regions 141–143 of the present embodiment are obtained by changing the arrangements of the second contact diffusion regions 33a–33c in the conventional reference section shown in FIG. 4. More specifically, among the second contact diffusion regions 33a–33d provided so as to be capable of connection with the virtual ground line 28 via a contact hole, the second contact diffusion regions 33a–33c other than the second contact diffusion region 33d that is actually connected to the virtual ground line 28 via the contact hole 35 are shifted to under the bit line 27 so that they can be connected to the bit line 27 via a contact hole. It follows from this that all the first and third contact diffusion regions 121–124, 141–143 but the second contact diffusion region 131 actually connected to the virtual ground line 28 via the contact hole 139 are placed under the bit line 27.

Now, referring to FIGS. 8, 9, and 10, the reference section 100 of the present embodiment comprises a first reference cell block 201 and a second reference cell block 202. The first reference cell block 201 includes a cell transistor part 111, block selecting transistor parts 112, a first contact diffusion region 221, and a second contact diffusion region 231. The first contact diffusion region 221 is placed under a bit line 120a and can be connected to this bit line 120a via a not-shown contact hole as needed. The second contact diffusion region 231 is placed under a virtual ground line 130a, and is connected to this virtual ground line 130a via a contact hole 239. The second reference cell block 202 includes a cell transistor part 111, block selecting transistor parts 112, the first contact diffusion region 221 which is placed under the bit line 120a and can be connected to this bit line 120a via a not-shown contact hole as needed, and a third contact diffusion region 241. The third contact diffusion region 241 is connected to the bit line 120a via a contact hole 229. Here, each of the block selecting transistor parts 112 is interposed between a cell transistor part 111 and any of the first through third contact diffusion regions 221, 231, and 241.

A cell transistor part 111 comprises a plurality of diffusion layers 150 arranged parallel to one another, and a plurality of word lines 21b arranged parallel to one another along a direction orthogonal to the diffusion layers 150. The cell transistor part 111 also comprises a plurality of cell transistors having sources and drains made of the intersections of the diffusion layers 150 and the word lines 21b, and channels made of the portions sandwiched between the sources and drains. Each of the cell transistors is formed to have the same size as that of the memory cell transistors in the memory cell array sections.

A block selecting transistor part 112 comprises a plurality of diffusion layers 150 arranged parallel to one another, and a plurality of block selecting signal lines 22b arranged parallel to one another along a direction orthogonal to the diffusion layers 150. The block selecting transistor part 112 includes a plurality of block selecting transistors having sources and drains made of the intersections of the diffusion layers 150 and the block selecting signal lines 22b, and channels made of the portions sandwiched between the sources and drains.

Moreover, the diffusion layers 150 in the cell transistor part 111 and the block selecting transistor parts 112 within each reference cell block are arranged and formed so as to form a current path between upper and lower reference cell blocks sandwiching the contact diffusion region 221, 241 except the one placed at the end of the reference section.

Incidentally, the diffusion layers, word lines, and block selecting signal lines in each reference cell block desirably have the same widths, array pitches, and directions as those of the diffusion layers, word lines, and block selecting signal lines in the memory cell blocks constituting the memory cell array sections.

Having the above-described configuration, any reference cell block selected for reference current generation activates only a single cell transistor among the cell transistors included in its cell transistor part 111, the single cell transistor corresponding to a word line selected and activated from among the word lines 21b.

Besides, assuming that the number of reference cell blocks arranged between the second contact diffusion region and the end of the reference section is X (X is an integer not less than "1"), the number of stages of the reference cell blocks connectable in series can be selected freely from among "1" through X, allowing a selection free from the constraints on the odd/even number of stages. That is, it becomes possible for the reference current to select an arbitrary value from among 1/1 through 1/X of IS0.

Now, description will be given of a second embodiment of the present invention.

Figure 11:
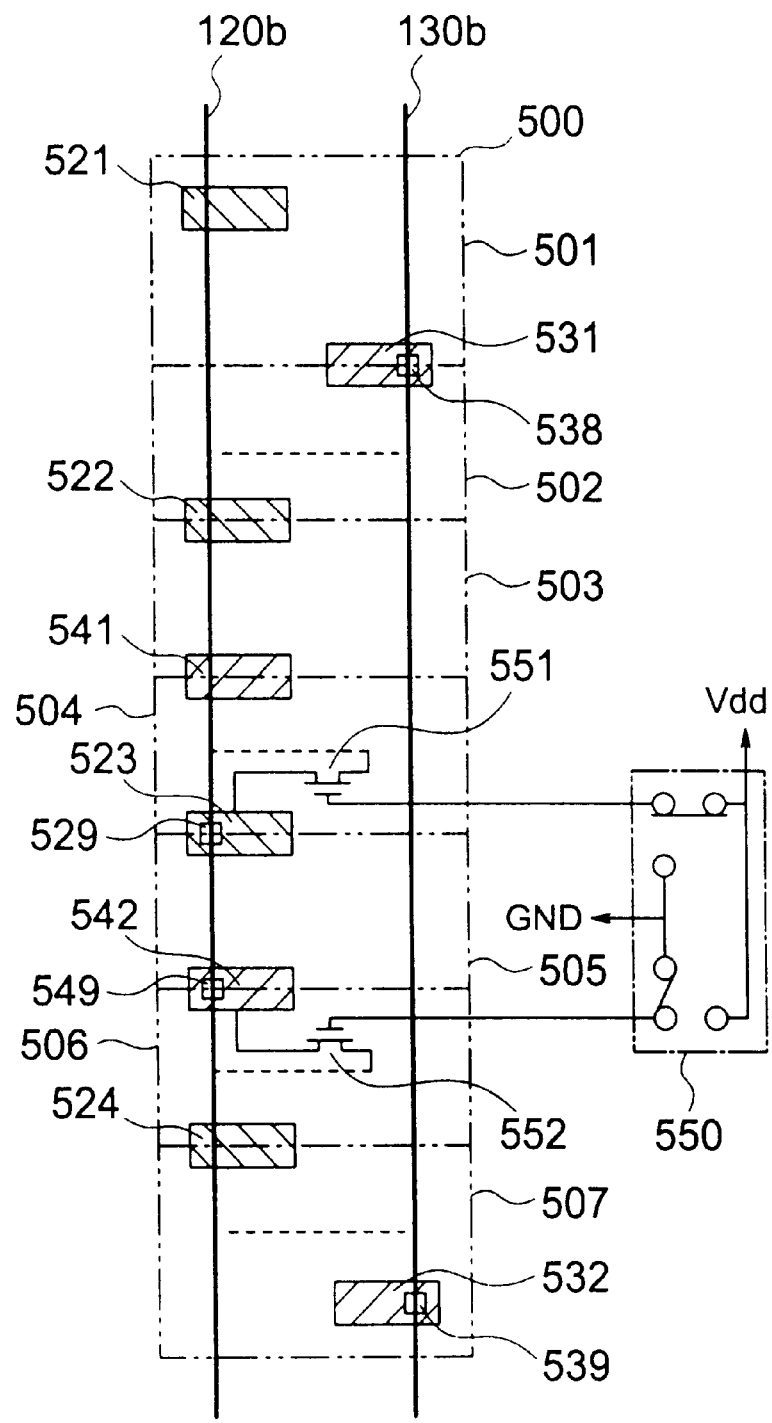
FIG. 11 is a schematic plan view showing, in simplified form, the arrangement of the contact diffusion regions in each reference cell block constituting a reference section in the semiconductor memory device according to a second embodiment of the present invention.

FIG. 11 is a schematic diagram showing the arrangement of the contact diffusion regions in each reference cell block constituting a reference section of the present embodiment, in a simplified form for the sake of clarity. Incidentally, each reference cell block has the same interior configuration as that of the first embodiment, and therefore graphical representation and description thereof will be omitted here.

Referring to FIG. 11, a reference section 500 of the present embodiment is composed of e.g. seven reference cell blocks 501–507. Here, four first contact diffusion regions 521–524 and two third contact diffusion regions 541, 542 are arranged under a bit line 120b. Two second contact diffusion regions 531 and 532 are placed under a virtual ground line 130b so as to sandwich the six reference cell blocks 502–507 therebetween. The second contact diffusion regions 531 and 532 are provided with contact holes 538 and 539, respectively, and thereby connected to the virtual ground line 130b.

Then, for example, the first contact diffusion region 523 positioned at the third stage toward the contact hole 539 made in the second contact diffusion region 532 from the contact hole 538 made in the second contact diffusion region 531 is provided with a contact hole 529 and thereby connected to the bit line 120b. The third contact diffusion region 542 positioned at the second stage toward the contact hole 538 from the contact hole 539 is also provided with a contact hole 549 and thereby connected to the bit line 120b.

MOS transistors 551 and 552 in the block selecting transistor parts are provided so that the gate signals thereto can select either of the paths connected to the contact holes 529 or 549 to be activated. Then, the connection in a metal switching section 550 can be changed to switch the reference current value between IS0/2 and IS0/3 in the metal process. (In this example, the path connected to the contact hole 529 is activated for the reference current value of IS0/3.)

When a plurality of second contact diffusion regions are arranged beneath an identical virtual ground line as in the present embodiment, the number of stages of the reference cell blocks connectable in series can be selected from among "1" through (Y−1), where Y is the number of reference cell blocks interposed between adjacent two second contact diffusion regions (Y is an integer not less than "2"). Accordingly, the reference current can take any value from among 1/1 through 1/(Y−1) of IS0.

Both the embodiments have dealt with the examples where the number of reference cell blocks constituting a reference section, the number and arrangement of second contact diffusion regions, the numbers of word lines and block selecting signal lines, and the like are restricted for the sake of clarity, whereas the present invention is not limited thereto. Needless to add, the number of reference cell blocks constituting a reference section, the arrangement and number of second contact diffusion regions, the numbers of word lines and block selecting signal lines, and the like may be set as appropriate in accordance with the scale, the application, and the like of the semiconductor memory device.

As has been described above, a semiconductor memory device according to the present invention includes first and second contact diffusion regions arranged under a bit line and a virtual line, respectively. The first and second contact diffusion regions are to establish connection of the bit line and the virtual line with diffusion layers which constitute the cell transistor parts and the block selecting transistor parts of a reference section for generating a reference current in the semiconductor memory device. All the second contact diffusion regions are connected to the virtual ground line via contact holes. In other words, all those contact diffusion regions not connected to the virtual ground lines are arranged under the bit line. Therefore, the number of stages of the reference cell blocks to be connected in series to set a reference current value is not limited to odd numbers as heretofore, and can be set freely. This means select levels of the reference current value approximately twice the conventional ones, thereby producing the effect of allowing finer settings of the reference current value.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A semiconductor memory device comprising:
   a memory cell array section having a plurality of memory cell blocks arranged in a matrix, said memory cell blocks each including a plurality of memory cells; and a reference section for generating a reference current for use in identification of data in said memory cells;

said reference section including
- a plurality of diffusion layers arranged parallel to each other,
- a plurality of word lines arranged parallel to each other along a direction orthogonal to said diffusion layers,
- a plurality of MOS transistors having sources and drains made of the intersections of said diffusion layers and said word lines, and channels made of the portions sandwiched between said sources and drains, and
- first contact diffusion regions and second contact diffusion regions for connecting said diffusion layers with a bit line and a virtual ground line;
- wherein each of said second contact diffusion regions is provided with a contact to said virtual ground line.

2. A semiconductor memory device comprising:

a memory cell array section having a plurality of memory cell blocks arranged in a matrix, said memory cell blocks each including a plurality of memory cells; and a reference section for generating a reference current for use in identification of data in said memory cells;

said reference section includes a plurality of unit reference cell blocks each having the same size in a bit-line direction as that of said memory cell blocks;

the array pitch and the number of said reference cell blocks in said reference section being the same as the array pitch and the number in said bit-line direction of said memory cell blocks in said memory cell array section;

each of said reference cell blocks includes
- a plurality of diffusion layers arranged parallel to each other,
- a plurality of word lines arranged parallel to each other along a direction orthogonal to said diffusion layers,
- a plurality of MOS transistors having sources and drains made of the intersections of said diffusion layers and said word lines, and channels made of the portions sandwiched between said sources and drains,
- a first contact diffusion region and a second contact diffusion region for connecting said diffusion layers with a bit line and a virtual ground line,
- a plurality of block selecting signal lines arranged between said word lines and at least either one of said first contact diffusion region and said second contact diffusion region so as to be parallel to said word lines, and
- block selecting transistors having sources and drains made of the intersections of said plurality of diffusion layers and said block selecting signal lines;
- wherein all said second contact diffusion regions are provided with a contact to said virtual ground line.

3. The semiconductor memory device according to claim 1, wherein each of said memory cell blocks includes:
- a plurality of diffusion layers arranged parallel to each other;
- a first contact diffusion region and a second contact diffusion region for connecting said diffusion layers with a bit line and a virtual ground line, respectively;
- a plurality of word lines arranged between said first contact diffusion region and said second contact diffusion region so as to be parallel to each other along a direction orthogonal to said diffusion layers;
- a plurality of memory cells having sources and drains made of the intersections of said diffusion layers and said word lines, and channels made of the portions sandwiched between said sources and drains;
- a plurality of block selecting signal lines arranged between said word lines and said first contact diffusion region as well as second contact diffusion region, so as to be parallel to said word lines; and
- block selecting transistors having sources and drains made of the intersections of said plurality of diffusion layers and said block selecting signal lines.

4. The semiconductor memory device according to claim 2, wherein each of said memory cell blocks includes:
- a plurality of diffusion layers arranged parallel to each other;
- a first contact diffusion region and a second contact diffusion region for connecting said diffusion layers with a bit line and a virtual ground line, respectively;
- a plurality of word lines arranged between said first contact diffusion region and said second contact diffusion region so as to be parallel to each other along a direction orthogonal to said diffusion layers;
- a plurality of memory cells having sources and drains made of the intersections of said diffusion layers and said word lines, and channels made of the portions sandwiched between said sources and drains;
- a plurality of block selecting signal lines arranged between said word lines and said first contact diffusion region as well as second contact diffusion region, so as to be parallel to said word lines; and
- block selecting transistors having sources and drains made of the intersections of said plurality of diffusion layers and said block selecting signal lines.

5. The semiconductor memory device according to claim 3, wherein
said word lines, said diffusion layers, and said block selecting signal lines in said reference cell blocks and said memory cell blocks are identical to each other in array pitch and in width.

6. The semiconductor memory device according to claim 4, wherein
said word lines, said diffusion layers, and said block selecting signal lines in said reference cell blocks and said memory cell blocks are identical to each other in array pitch and in width.

7. The semiconductor memory device according to claim 2, wherein
any of said reference cell blocks, when generating said reference current, activates no more than one MOS transistor among said plurality of MOS transistors made of said word lines and said diffusion layers in said reference cell block.

8. The semiconductor memory device according to claim 4, wherein
any of said reference cell blocks, when generating said reference current, activates no more than one MOS transistor among said plurality of MOS transistors made of said word lines and said diffusion layers in said reference cell block.

9. A semiconductor memory device comprising memory cell blocks and reference cell blocks each including:
- a plurality of diffusion layers arranged parallel to each other;
- a first contact diffusion region and a second contact diffusion region formed under a bit line and a virtual ground line, for connecting said diffusion layers with said bit line and said virtual ground line, respectively;

a plurality of word lines arranged between said first contact diffusion region and said contact diffusion region so as to be parallel to each other along a direction orthogonal to said diffusion layers;

a plurality of memory cells having sources and drains made of the intersections of said diffusion layers and said word lines, and channels made of the portions sandwiched between said sources and drains;

a plurality of block selecting signal lines arranged between said word lines and said first contact diffusion region as well as said second contact diffusion region, so as to be parallel to said word lines; and block selecting transistors having sources and drains made of the intersections of said plurality of diffusion layers and said block selecting signal lines;

wherein at least one said reference cell block further comprising a plurality of third contact diffusion regions not connected to said virtual ground line, said reference cell block disposed in parallel with said word lines under said bit line.

* * * * *